US006843882B2

(12) United States Patent
Janakiraman et al.

(10) Patent No.: US 6,843,882 B2
(45) Date of Patent: Jan. 18, 2005

(54) GAS FLOW CONTROL IN A WAFER PROCESSING SYSTEM HAVING MULTIPLE CHAMBERS FOR PERFORMING SAME PROCESS

(75) Inventors: Karthik Janakiraman, San Jose, CA (US); Victor Wang, Fremont, CA (US); Vikash Banthia, Sunnyvale, CA (US); Teresa Winson, Sunnyvale, CA (US); Nitin Ingle, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 91 days.

(21) Appl. No.: 10/263,556

(22) Filed: Oct. 2, 2002

(65) Prior Publication Data

US 2004/0007176 A1 Jan. 15, 2004

Related U.S. Application Data

(60) Provisional application No. 60/396,537, filed on Jul. 15, 2002.

(51) Int. Cl.[7] .................... C23C 16/455; C23C 16/00; C23F 1/00; H01L 21/306
(52) U.S. Cl. ................... 156/345.29; 156/345.31; 156/345.32; 156/345.33; 156/345.34; 118/715; 118/719
(58) Field of Search ................ 118/715, 719; 156/345.29, 345.31, 345.32, 345.33, 345.34

(56) References Cited

U.S. PATENT DOCUMENTS

| | | | | |
|---|---|---|---|---|
| 4,492,716 A | * | 1/1985 | Yamazaki | 438/483 |
| 5,269,847 A | * | 12/1993 | Anderson et al. | 118/715 |
| 5,582,944 A | * | 12/1996 | Yamamura et al. | 430/66 |
| 5,879,459 A | * | 3/1999 | Gadgil et al. | 118/715 |
| 5,916,369 A | * | 6/1999 | Anderson et al. | 118/715 |
| 6,019,848 A | * | 2/2000 | Frankel et al. | 118/715 |
| 6,056,024 A | * | 5/2000 | Noah et al. | 141/21 |
| 6,261,374 B1 | * | 7/2001 | Bang et al. | 118/726 |
| 6,406,519 B1 | * | 6/2002 | Tom et al. | 95/95 |
| 6,668,752 B2 | * | 12/2003 | Yao | 118/723 E |
| 2001/0047756 A1 | * | 12/2001 | Bartholomew et al. | 118/715 |
| 2002/0033233 A1 | * | 3/2002 | Savas | 156/345.48 |
| 2003/0226588 A1 | * | 12/2003 | Olander et al. | 137/240 |
| 2004/0007176 A1 | * | 1/2004 | Janakiraman et al. | 118/715 |

* cited by examiner

*Primary Examiner*—Jeffrie R. Lund
(74) *Attorney, Agent, or Firm*—Townsend & Townsend & Crew

(57) ABSTRACT

A system for processing substrates comprises a plurality of process chambers. Each process chamber includes an inlet gas distribution member connected to an inlet gas line to distribute gas from the inlet gas line into the process chamber, and a gas outlet. The inlet gas distribution member has an inlet gas distribution member impedance to a gas flow through the inlet gas distribution member into the process chamber. The plurality of process chambers are substantially identical. A source gas delivery line is connected to the inlet gas lines of the plurality of process chambers to supply a gas flow to be divided into the inlet gas lines. A plurality of tunable upstream gas restrictors are each disposed in one of the inlet gas lines connected to the inlet gas distribution members of the process chambers and are configured to adjust a flow rate into the corresponding process chamber.

8 Claims, 7 Drawing Sheets

GAS FLOW CONTROL IN A WAFER PROCESSING SYSTEM HAVING MULTIPLE CHAMBERS FOR PERFORMING SAME PROCESS

CROSS-REFERENCES TO RELATED APPLICATIONS

This application is based on and claims the benefit of U.S. Provisional Patent Application No. 60/396,537, filed Jul. 15, 2002, the entire disclosure of which is incorporated herein by reference.

BACKGROUND OF THE INVENTION

The present invention relates to equipment for processing semiconductor wafers, and in particular to a method and apparatus for processing two or more wafers at the same time in two or more processing chambers.

Numerous techniques and apparatus are well known for use in the processing of semiconductor wafers to make integrated circuits. The state of the art fabrication facilities (known as "fabs") for carrying out such processes are typically large buildings within which "clean rooms" of thousands of square feet of floor area are provided. The clean rooms contain the equipment within which the various semiconductor fabrication processes are carried out, for example, chemical vapor deposition equipment for deposition of conductive or insulative materials on the wafers, ion implantation equipment for introduction of impurities into the wafers, furnaces for heating the wafers, plasma etchers for removing material from the wafers, etc.

Compared even to their recent predecessors, clean rooms today are extraordinarily clean, often having particle densities of less than class 1. Such low particle densities require expensive equipment to purify the air in the clean room, as well as unusual care in all other respects. The result of these measures is that floor space in such clean rooms is expensive. The per-square-foot construction cost, as well as maintenance cost, is high.

Another trend in the manufacture of integrated circuits is the use of single wafer processing equipment. In single wafer equipment, processing is carried out on the wafers one wafer at a time. That is, one wafer is introduced from a cassette holding many wafers into the processing chamber. The necessary process on the wafer is carried out in the chamber, then the wafer is removed from the chamber and the next wafer introduced. Typically, such single wafer processing chambers are clustered around a central robot which can load the chambers with individual wafers. The use of single wafer processing provides higher yields by making the process more controllable across the entire wafer, typically 8 inches in diameter, with 12 inches in the near future. The higher yields produced by single wafer systems have resulted in their use in many of the advanced fabrication facilities used today in the semiconductor industry.

In some cases, it is desirable to perform the same process in a plurality of chambers that are stacked together in a multideck arrangement or clustered together in a side-to-side arrangement. These chambers may share the same resources such as, for example, a process gas system, a vacuum pumping system, a radio frequency system, and a control system. To achieve identical wafer processing results in the chambers can be difficult. For instance, the control of process gas flow through the chambers is important to achieve matching of film properties formed on the wafers in the respective chambers. The gases from the process gas system may not split equally among the plurality of chambers. The volume of gas flowing into each chamber is dependent on the flow conductance through that chamber. Flow conductance is in turn dependent on manufacturing tolerances of the chamber components including the input manifold, mixing insert, blocker plate, faceplate, and the like. Perfect matching of the chamber components is difficult. The use of mass flow controllers for the chambers to compensate for manufacturing tolerances is unsuitable if the precursor for the process gas is a liquid (e.g., TEOS) due to condensation problems.

BRIEF SUMMARY OF THE INVENTION

Embodiments of the present invention pertain to a method and apparatus for processing two or more wafers at the same time in two or more processing chambers. To compensate for manufacturing tolerances in components between chambers and for other differences between the chambers, gas flows through the chambers are controlled to achieve substantially identical process results in the chambers. This is done by manipulating the flow impedances along the flow paths through the chambers.

In one embodiment, a system for processing substrates comprises a plurality of process chambers. Each process chamber includes an inlet gas distribution member connected to an inlet gas line to distribute gas from the inlet gas line into the process chamber, a substrate support to support a substrate at a spacing distance from the inlet gas distribution member, and a gas outlet. The inlet gas distribution member has an inlet gas distribution member impedance to a gas flow through the inlet gas distribution member into the process chamber. The plurality of process chambers are substantially identical. A source gas delivery line is connected to the inlet gas lines of the plurality of process chambers to supply a gas flow to be divided into the inlet gas lines. A plurality of tunable upstream gas restrictors are each disposed in one of the inlet gas lines connected to the inlet gas distribution members of the process chambers and are configured to adjust a flow rate into the corresponding process chamber. Each upstream gas restrictor is tunable to adjust a tunable upstream gas restrictor impedance to achieve substantially identical process results in the plurality of chambers.

In another embodiment, a system for processing substrates comprises a plurality of process chambers. Each process chamber includes an inlet gas distribution member connected to an inlet gas line to distribute gas from the inlet gas line into the process chamber, a substrate support to support a substrate at a spacing distance from the inlet gas distribution member, and a gas outlet. Each flow path through the inlet gas line and the inlet gas distribution member to the gas outlet of each process chamber has a total flow impedance to a gas flow through the process chamber. The plurality of process chambers are substantially identical. A source gas delivery line is connected to the inlet gas lines of the plurality of process chambers to supply a gas flow to be divided into the inlet gas lines. A plurality of downstream flow restrictors are each disposed near one of the gas outlets of one of the process chambers. The downstream flow restrictors have downstream flow restrictor impedances to the gas flows through the process chambers. The downstream flow restrictor impedances are substantially equal. Each downstream flow restrictor impedance of the downstream flow restrictor is nearly equal to the total flow impedance of the flow path through the corresponding process chamber.

In another embodiment, a system for processing substrates comprises a plurality of process chambers, each process chamber including a gas inlet and a gas outlet. A plurality of inlet gas lines are each connected to a gas inlet of the one of the process chambers. Each inlet gas line has an orifice. A source gas delivery line is connected to the inlet gas lines of the plurality of process chambers to supply a gas flow to be divided into the inlet gas lines. The orifices in the inlet gas lines are sized such that the source gas delivery line has a pressure which is more than twice the pressure in a downstream region of each of the inlet gas lines downstream of the orifice in the inlet gas line.

DETAILED DESCRIPTION OF THE INVENTION

Figure 1:
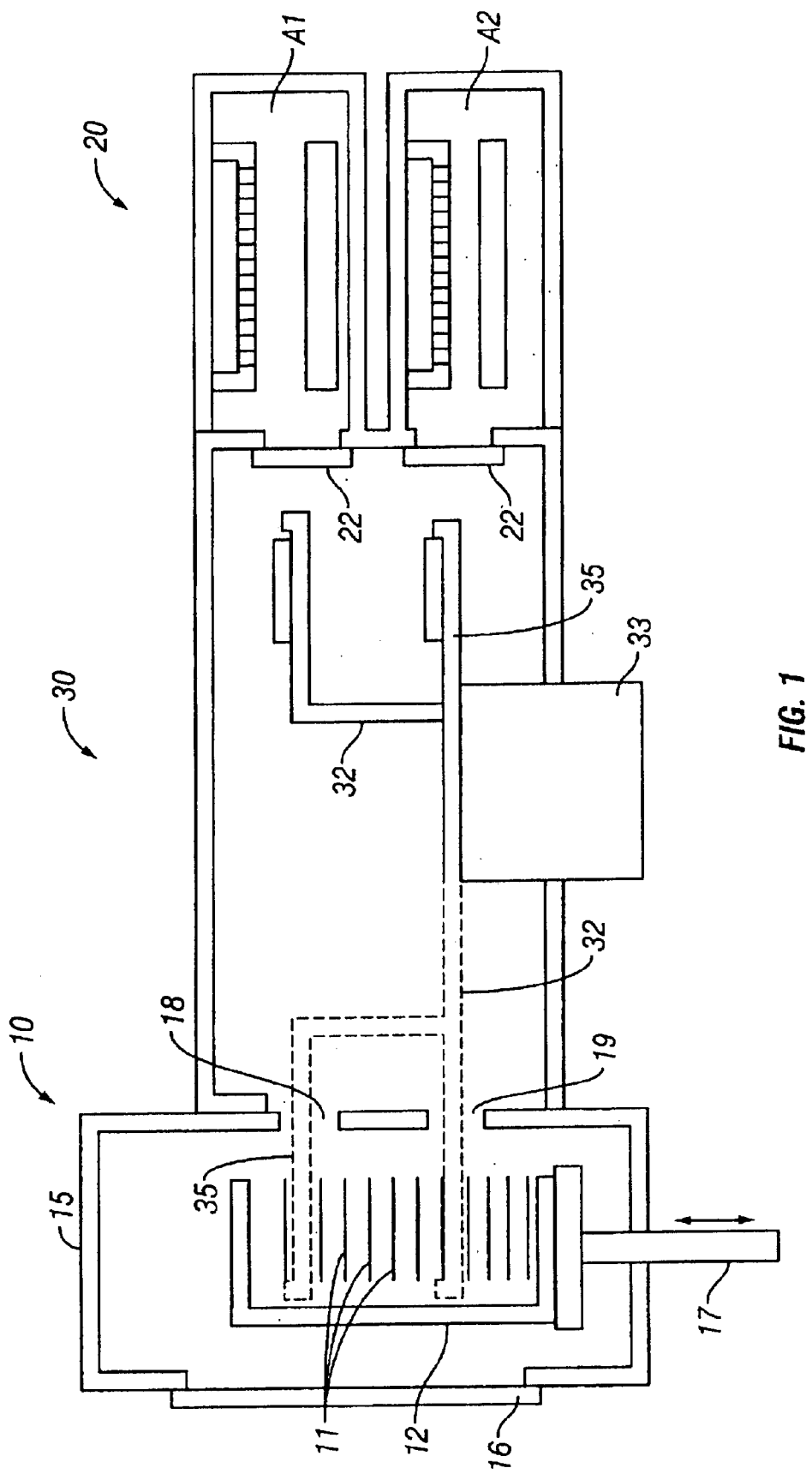
FIG. 1 is a cross-sectional view of a multideck wafer processing system according to one embodiment of the present invention.

FIG. 1 is a cross-sectional view of a multideck wafer processing system. The system shown in FIG. 1 includes a wafer storage mechanism 10 in which a group of wafers is stored, typically on the order of 4 to 100 wafers. Also shown in FIG. 1 are a pair of wafer processing chambers A1 and A2 situated generally in a region 20. Importantly, as will be discussed below, the pair of processing chambers is disposed one above the other. Each chamber provides the capability of processing one or more wafers therein. Between the wafer processing chambers A1 and A2 and the wafer storage mechanism 10 is positioned a wafer transfer chamber 30. The wafer transfer chamber 30 is adapted to transfer wafers from the storage mechanism 10 and place those wafers in the processing chambers. Each of these elements of the system is discussed in further detail below.

In the fabrication of integrated circuits using silicon wafers, or other type semiconductor wafers, the wafers typically are provided to the processing apparatus in a wafer cassette 12. The wafer cassette 12 is usually a plastic, metal, or ceramic material in which the wafers are positioned in slots adjoining each other. Each slot includes protrusions to maintain each wafer in a separate spaced apart position from the adjoining wafers. A loadlock 15 typically includes an openable door 16 and an elevator 17 upon which the cassette rides. The loadlock 15 also includes additional openings 18 and 19 on one side thereof. These openings enable a robot arm 32 to reach into the cassette and remove wafers 11.

In operation, a cassette 12 is placed in loadlock 15 and door 16 is closed. At this time doors 18 and 19 also will be closed. Tubing, or other suitable interconnection piping, couples the loadlock 15 to a vacuum pump. After the cassette is introduced and door 16 closed, the vacuum pump is engaged and the pressure within the loadlock reduced to a pressure corresponding to that in wafer transfer chamber 30. The doors over openings 18 and 19 then are opened to enable robot arm 32 to extract wafers from cassette 12. The remainder of the semiconductor fabrication operation is then carried out without the need for reopening the loadlock. Once the entire cassette of wafers has been processed, the loadlock 15 is vented to atmospheric pressure; the door 16 is opened; the completed cassette is removed; and a new cassette is introduced. In other embodiments the system described can be employed to perform processes at atmospheric pressure, or at higher than atmospheric pressures. In such cases the vacuum pump may be replaced by other pumps which provide the desired process pressure.

As mentioned, also coupled to wafer transfer chamber 30 are a series of processing chambers 20. These processing chambers are shown on the right-hand side of FIG. 1 and are designated chamber A1 and chamber A2. Although only two vertically arranged processing chambers are shown in FIG. 1, it should be appreciated that as many as desired may be stacked vertically.

In one embodiment, the processing chambers (e.g., chamber A1 and A2) include identical components and are adapted to carry out identical semiconductor processing operations, or identical sets of processing operations. For example, the semiconductor processing chambers may include identical cathode assemblies, chamber walls and liners, lids or ceilings, gas injectors, pumping locations and surface temperature controls. Also, the chambers may have identical volumes. Being identically configured allows the chamber to simultaneously perform identical chemical vapor deposition operations in which an insulating or a conductive material is deposited on a wafer disposed in each respective chamber. In other embodiments, the identical semiconductor processing chambers are used for etching of the wafers, typically through openings in a photoresist or other type of masking layer. Of course, any suitable semiconductor operation can be performed simultaneously in each of these chambers, such as plasma vapor deposition, epitaxial layer deposition, etc. As will be described, the choice of such operation is arbitrary within the context of the system described herein. For illustration of a typical process, the chambers depicted in FIG. 1 include schematic illustrations of a "showerhead" used for chemical vapor deposition, and a wafer heater, upon which the wafer is positioned for processing.

Wafer transfer chamber 30 is provided between the vertically arranged wafer processing chambers 20 and loadlock 15. The wafer transfer chamber includes a robot 33 which moves an arm 32 among a series of desired positions. In FIG. 1 the arm is shown in two different positions. In the first position on the left-hand side of the figure, the arm is in position to extract two wafers 11 from cassette 12. (In embodiments where more than one wafer per chamber are processed, the robot may handle multiple wafers in one, or a few, procedures.) Support fingers 35 extend from arm 32 beneath the wafers. These fingers have been inserted into the gap between the adjoining wafers, and the robot arm lifted slightly to the point where the weight of the wafers bears on the support fingers of the arm.

As the operation continues, the arm will move to a second position, shown generally on the right-hand side of wafer transfer chamber 30. The wafers are placed in the second position by activation of the robot 33 which moves the arm 32 and support fingers 35 into the desired position. In this position the wafers are resting on the support fingers. This is in preparation for the two slit valves 22 to be opened to permit the wafers to be moved into the processing chambers. Because the loadlock and the wafer transfer chamber are maintained at essentially the same pressure, minimal or no use of the vacuum pump for the transfer operation is needed.

Once the wafers are in the position shown on the right-hand side of the wafer transfer chamber 30, the slit valves 22 may be opened and the wafers inserted into the processing chambers, again using the robot 33. If the chambers are single wafer chambers, a desired process is then carried out on the wafers. On the other hand, if either or both chambers is designed for handling more than one wafer at a time, then additional wafers are inserted and the desired process carried out. Ultimately the wafers are removed from the processing chambers and returned to the cassette. Another set of wafers is then removed from the cassette and inserted into the processing chambers. This process is repeated until all of the wafers in the cassette have been processed, and then a new cassette is introduced and the process repeated again. Of course, if multiple loadlocks are available, then a cassette from another loadlock can be used as a source of wafers while the loadlock depicted is refilled.

While the use of a single robot with the capability of handling two or more wafers at a time is preferred, in some embodiments multiple robots are used. This is advantageous for situations in which the chambers are to be loaded at different times, for example, if two different processes are being performed, one in each of the stacked chambers.

In one embodiment, the two chambers A1 and A2 are designed with substantially the same configuration, so that two substrates may be treated with the same process within the chambers simultaneously. For example, both of the chambers may be configured to perform a plasma enhanced chemical vapor deposition, pad etch, etch back, or spacer etch process. In operation, the first and second substrates are inserted into the chambers A1 and A2, respectively, using the robot 33 (FIG. 1). The robot 33 has two support fingers or blades 35 to transfer the substrates from the cassette 12 into the two chambers A1 and A2 at the same time. Alternatively, the robot may have a single support finger and perform the transfer operation twice to transfer the substrates into the two chambers.

The two chambers A1 and A2 are provided with substantially the same configuration to obtain process uniformity between the chambers. For example, identical chamber walls, gas injectors and the like are used in each chamber. Also, the gas input port, gas output port, substrate support pedestal, and the like are provided at the same relative locations in the two chambers. In one embodiment, the cathode assemblies or vacuum pump, or both, are not shared by the two chambers. In addition, substantially the same process parameters are used for the two chambers A1 and A2. Further embodiments and characteristics of multideck processing systems can be found in U.S. Pat. No. 6,176,667, which is incorporated herein by reference in its entirety.

Figure 2:
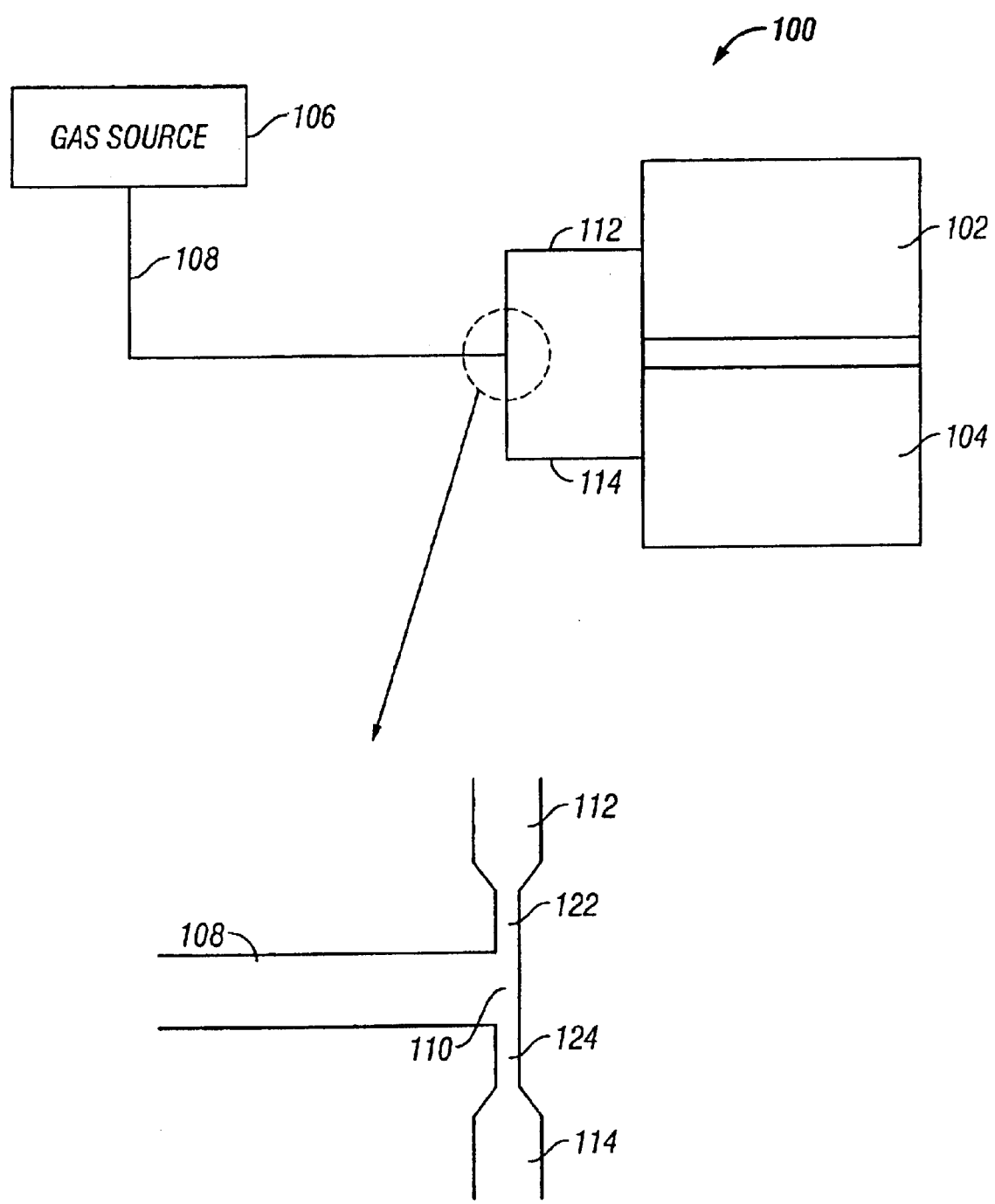
FIG. 2 is a schematic diagram of a multiple chamber system illustrating equal gas distribution by pressure control according to an embodiment of the present invention.

According to one embodiment, FIG. 2 shows a system 100 for providing equal gas flow to a pair of chambers 102, 104. The chambers 102, 104 may be stacked in a multideck arrangement (as in FIG. 1) or disposed adjacent to one another in a side-to-side arrangement. A common gas source 106 supplies one or more gases through a flow delivery line 108 which is split at a junction 110 into a first line 112 to the first chamber 102 and a second line 114 to the second chamber 104. A first orifice 122 is provided in the first line 112 adjacent the split junction 110 and a second orifice 124 is provided in the second line 114 adjacent the split junction 110. The gas source 106 may contain a vaporized liquid from a liquid precursor such as TEOS.

The flow rate in each downstream chamber 102, 104 depends only on the upstream pressure of each corresponding orifice 122, 124. The flow chokes when the downstream pressure across an orifice is less than half of the upstream pressure. The gas leaves the orifice at the velocity of sound. Tests have shown that any further decrease in the outlet or downstream pressure does not increase the flow beyond a maximum flow velocity. When the gas is at the maximum velocity through the orifice, minor flow conductance differences due to manufacturing tolerances between the chambers will not affect the distribution of the gases.

The pressure upstream of the split junction 110 is Pr, the pressure in the first line 112 downstream of the orifice 122 is PI, and the pressure in the second line 114 downstream of the orifice 124 is P2. In this embodiment, the downstream pressures P1 and P2 are each less than one-half the upstream pressure Pr (2P1<Pr; 2P2<Pr). In addition to ensuring that a sufficiently high upstream pressure Pr is provided, one way to meet the pressure criteria set forth above is by varying the cross-sectional sizes of the fluid delivery system, namely, the sizes of the upstream gas delivery line 108 and the orifices 122, 124. That is, the orifices 122, 124 should be sufficiently small in size compared to the size of the upstream line 108 to provide the choke necessary to achieve the pressure drop across the orifices 122, 124 to less than one half of the upstream pressure. Although FIG. 2 shows only two chambers 102, 104, it is understood that additional chambers may be included in the system. The flow control scheme works the same way for the other chambers as long as the downstream pressure in each chamber is less than one-half of the upstream pressure Pr. This embodiment is simplistic, but requires an upstream pressure Pr that is at least twice the downstream pressure in each chamber. In some cases, it may not be easy to implement or the best way to achieve the desired result. Alternative embodiments are presented below and may provide added flexibility or ease of achieving substantially identical process results in a plurality of chambers.

Figure 3:
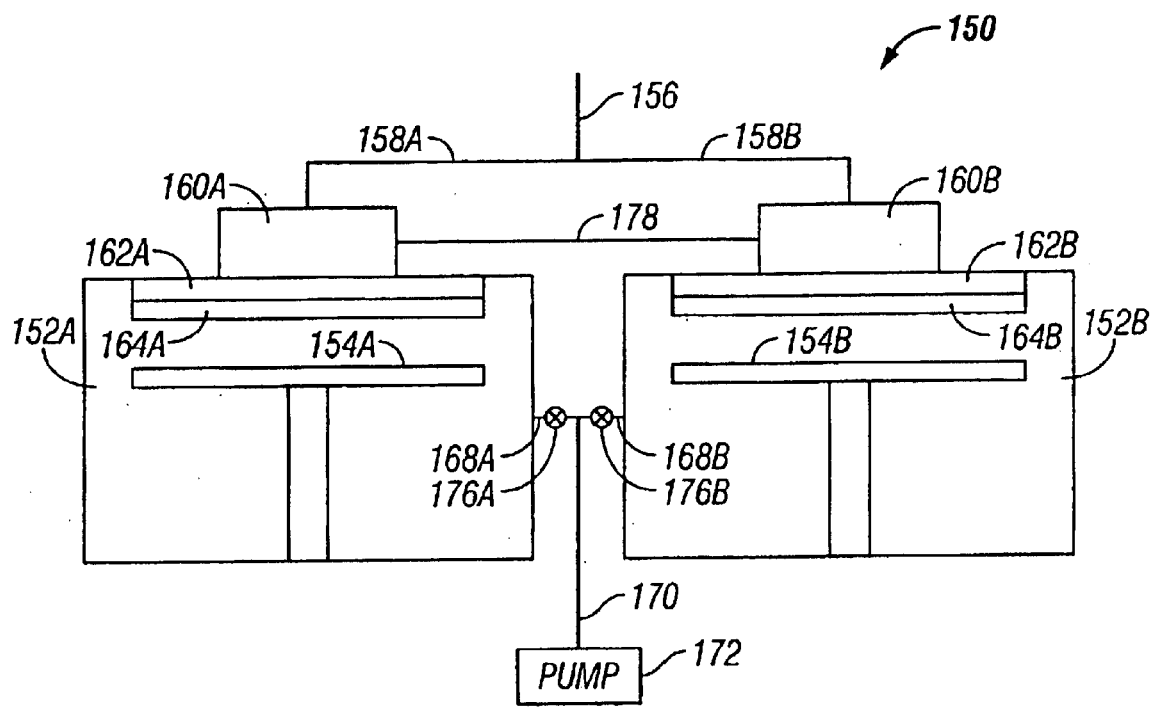
FIG. 3 is a schematic diagram of a multiple, side-to-side, chamber system illustrating equal gas distribution by downstream flow restriction according to another embodiment of the present invention.

In another embodiment shown in FIG. 3, a downstream flow restriction scheme is used to reduce the effects of flow conductance differences between the chambers. In this system 150, the two chambers 152A, 152B are disposed side-to-side, and each include a substrate support 154A, 154B. A common delivery gas line 156 splits between upstream gas lines 158A, 158B to the two chambers 152A, 152B. In this embodiment, the inlet gas flows from the gas lines 158A, 158B each pass through respective mixing block 160A, 160B, blocker plate 162A, 162B, and faceplate 164A, 164B into the interior of the corresponding chamber 152A, 152B. The chambers 152A, 152B have respective downstream exhaust lines 168A, 168B that lead to a common exhaust line 170 to a vacuum pump 172. Downstream flow restrictors 176A, 176B are provided in the exhaust lines 168A, 168B. A connecting line 178 may be provided between the two mixing blocks 160A, 160B to permit flow therebetween (e.g., clean gases) upon opening an appropriate valve (not shown). The downstream flow restrictors 176A, 176B may be fixed as illustrated in the present embodiment, but may be variable or tunable in other embodiments.

Figure 4:
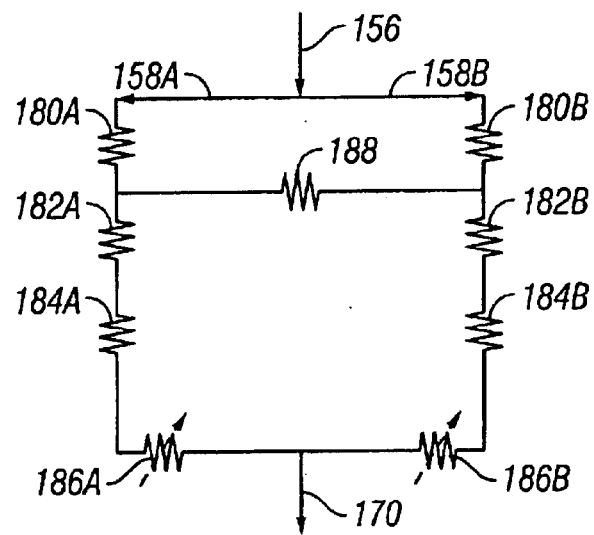
FIG. 4 is a simplified impedance diagram of the multiple chamber system of FIG. 3.

FIG. 4 is a schematic diagram showing the flow impedances of the various components in the system 150. For the first chamber 152A, the impedances along the first branch include mixing block impedance 180A, blocker plate impedance 182A, faceplate impedance 184A, and flow restrictor impedance 186A. For the second chamber 152B, the impedances along the second branch include mixing block impedance 180B, blocker plate impedance 182B, faceplate impedance 184B, and flow restrictor impedance 186B. The connecting path 178 between the mixing blocks 160A, 160B has a connecting path impedance 188. For fixed downstream flow restrictors 176A, 176B, the impedances 186A, 186B will be fixed. If the flow restrictors 176A, 176B are tunable, the impedances 186A, 186B will be variable, as indicated by the arrows shown in broken lines in FIG. 4.

To achieve equal flow division between the two chambers 152A, 152B, the total impedance along the first branch through the first chamber 152A needs to match the total impedance along the second branch through the second chamber 152B. Due to manufacturing tolerances, the impedances for the respective mixing blocks, blocker plates, and faceplates between the two chambers 152A, 152B will not match but will likely have minor variations. This tends to be particularly true for the blocker plates and faceplates which typically have large numbers of small holes (e.g., 1500× 0.025 inch holes in a blocker plate and 7500×0.062 inch holes in a faceplate). The connecting path impedance 188 typically is selected to be sufficiently large that it does not have any significant effect on matching the total impedances between the two branches to achieve equal flow.

One way to reduce the effects of the differences in the impedances between the flow branches through the two chambers 152A, 152B is to provide relatively large downstream flow restrictor impedances 186A, 186B by selecting appropriate sizes for the downstream flow restrictors 176A, 176B. If the flow restrictor impedances 186A and 186B are substantially equal and are dominant in their respective flow branches, then minor variations in the other impedances due to manufacturing tolerances will have relatively small or minimal effects on the overall flow conductances or impedances of the two flow branches through the two chambers 152A, 152B. As a result, substantially equal gas flows (e.g., equal to within about 5%) are achieved. For example, the flow restrictor impedance 186A may be at least about 400%, more preferably at least about 500% (e.g., about 500–550%), of the sum of the impedances 180A, 182A, 184A, and 186A in the first flow branch. Similarly, the flow restrictor impedance 186B may be at least about 400%, more preferably at least about 500% (e.g., about 500–550%), of the sum of the impedances 180B, 182B, 184B, and 186B in the second flow branch. In specific embodiments, the downstream flow restrictor impedances of the downstream flow restrictors for the process chambers are equal to within less than about 5% of each other.

Figure 5:
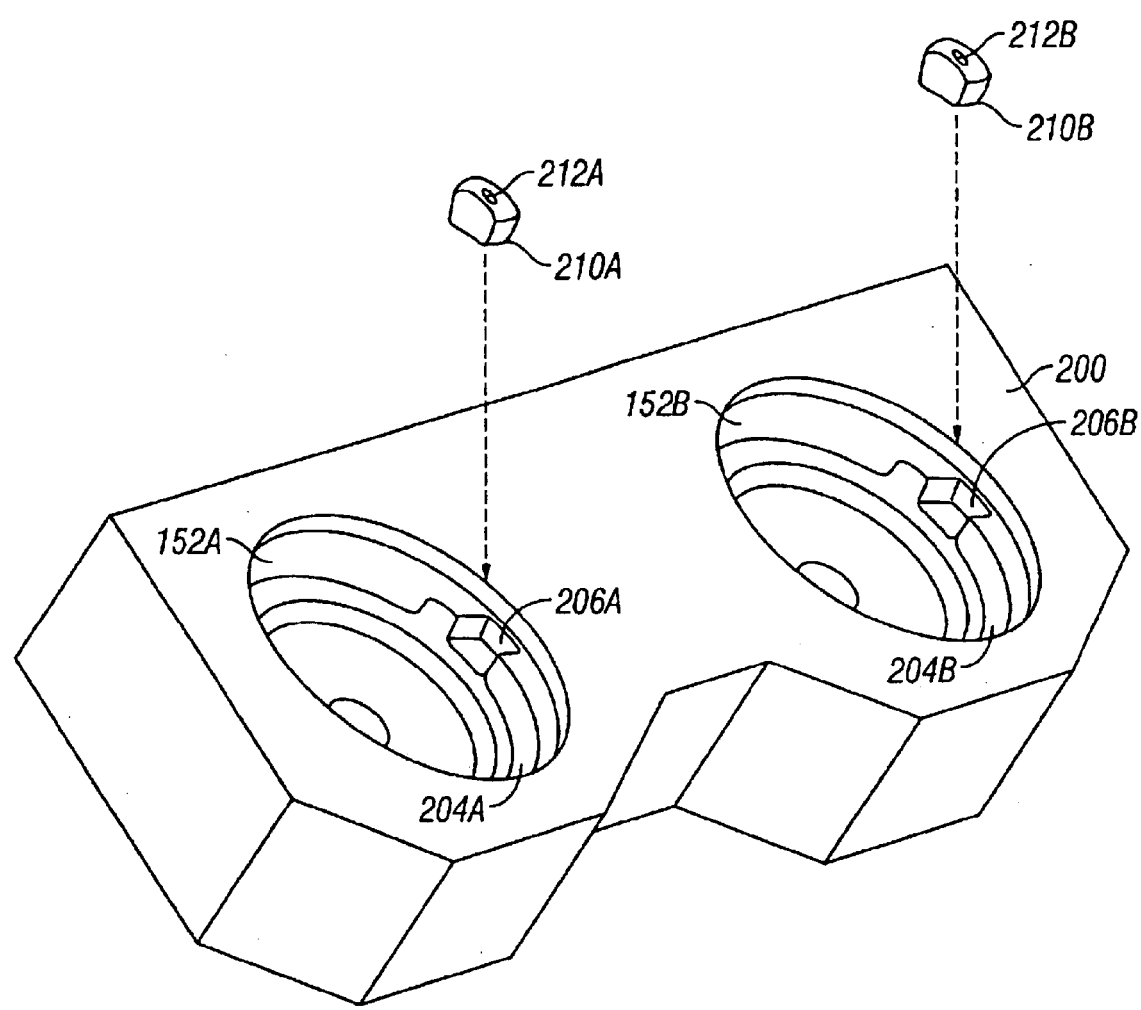
FIG. 5 is a perspective view of a portion of the multiple chamber system of FIG. 3 illustrating the downstream flow restriction according to an embodiment of the present invention.

The downstream flow restrictors 186A, 186B can be implemented in different ways. FIG. 5 shows one embodiment of providing downstream flow restriction. In FIG. 5, a block 200 includes lower chamber portions for side-to-side chambers 152A, 152B of FIG. 3. The block 200 includes a pair of liners and pumping rings 204A, 204B having pumping ports 206A, 206B through which gas flows pass to the exhaust line 170 drawn by the vacuum pump 172. The pumping ports 206A, 206B are configured and sized to provide the desired large flow impedances. Alternatively, the pumping ports 206A, 206B may be modified by adding orifice inserts 210A, 210B having the desired orifices 212A, 212B sized to achieve the large flow impedances. In specific examples, the orifices 212A, 212B may have fixed sizes of about 1 $cm^2$ to about 3 $cm^2$, which are about one time to about four times larger in size than the apertures of the block plates 162A, 162B and faceplates 164A, 164B. For instance, a 1 $cm^2$ orifice may provide about four times the resistance of the faceplate, while a 2 $cm^2$ may provide about two times the resistance of the blocker plate and the faceplate. Increasing the downstream flow restriction by decreasing the size of the orifices 212A, 212B reduces the effects of flow conductance differences between the chambers 152A, 152B. In those examples, the effects can be reduced by about 50% to about 80%.

Figure 6:
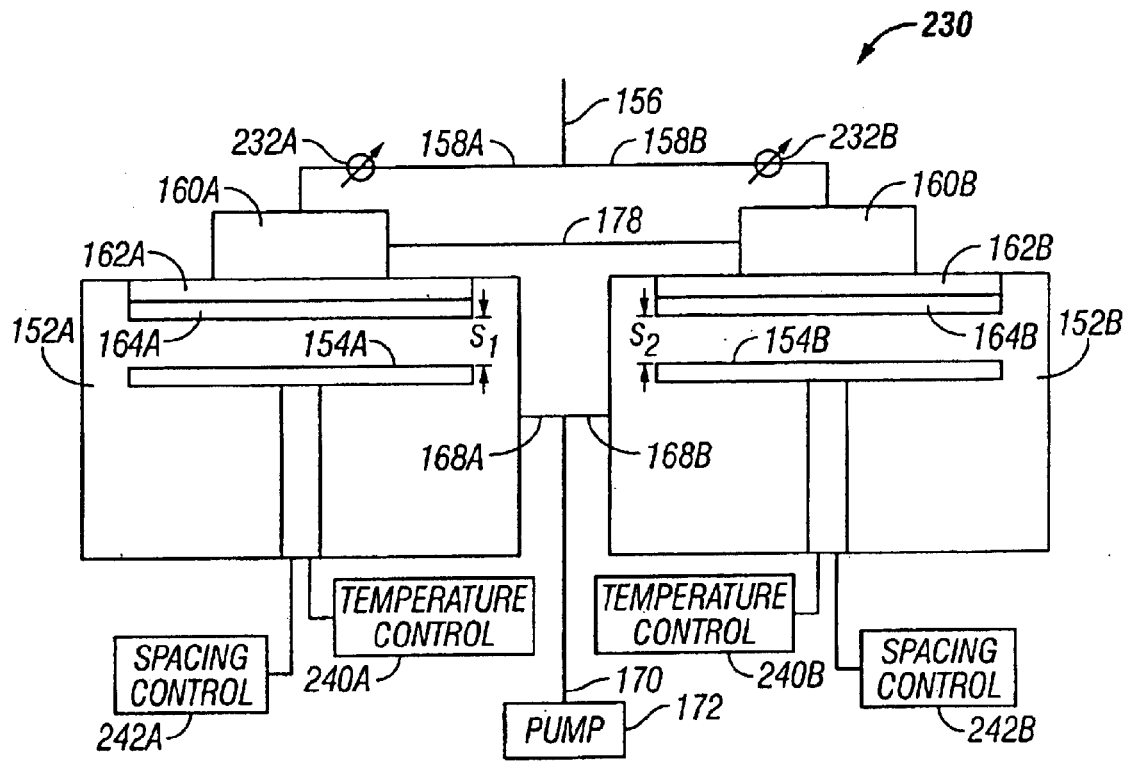
FIG. 6 is a schematic diagram of a multiple chamber system illustrating equal gas distribution by tunable upstream flow restriction according to another embodiment of the present invention.
Figure 7:
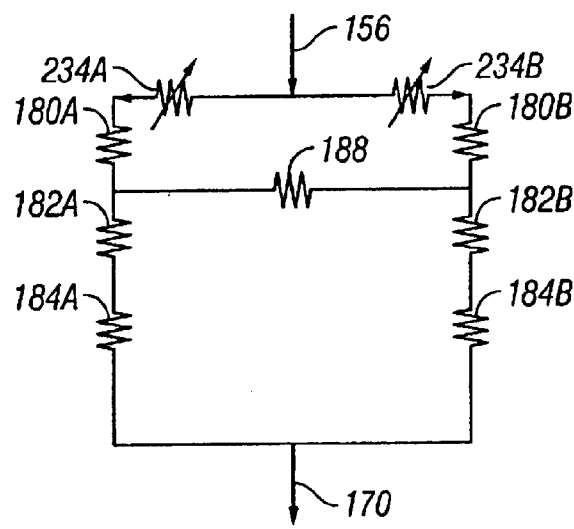
FIG. 7 is a simplified impedance diagram of the multiple chamber system of FIG. 6.

Instead of the use of large downstream flow restrictor impedances, the system 230 in FIG. 6 employs upstream tunable flow restrictors 232A, 232B in the upstream gas lines 158A, 158B for the two flow branches through the two chambers 152A, 152B. The upstream tunable flow restrictors 232A, 232B provide tunable impedances 234A, 234B as illustrated in FIG. 7. For convenience, the same reference characters are used in FIGS. 6 and 7 to denote the same components found in the system 150 of FIGS. 3 and 4.

The upstream tunable flow restrictors 232A, 232B may be any suitable valves or flow controllers. One example is a needle valve which is tunable to adjust the position of an occluding member in the flow line to vary the impedance. The two tunable flow restrictors 232A, 232B are independently adjustable to provide the gas flows through the chambers 152A, 152B to achieve the desired process results such as film deposition thickness or other characteristics.

Equalizing gas flows through the chambers alone does not necessarily equalize film deposition rates or produce the same processing results in the chambers. For instance, there may still be variations in the film thicknesses due to other factors such as temperature differences and size variations in the chamber components. For films such as borophosphosilicate (BPSG) films, which are used as pre-metal dielectric (PMD) layers for its low glass transition temperatures, metrics for film quality include thickness and dopant concentration. As integrated circuit (IC) manufacturers continue to shrink critical dimensions, not only are variations within wafers challenging for process integration, but wafer-to-wafer variations can affect subsequent processing such as chemical mechanical planarization (CMP), lithography steps, or the like. In particular, film thickness differences between wafers affect CMP process control. Because reflow is dependent on dopant concentrations for doped films, wafer-to-wafer differences in dopants affect gapfill performance. IC manufacturers are pushing film growth to be within 1% of targeted values with dopant matching within ±0.05 wt %. Wafer-to-wafer differences can be caused by imperfect chamber matching.

The inventors have found that, in addition to gas flow, two other process variables that can be adjusted to achieve chamber matching of dopants and thicknesses are wafer temperature and spacing (S1, S2) between the faceplate (164A, 164B) and the wafer support (154A, 154B) (see FIG. 6). Wafer temperature is adjusted by varying the temperature of the wafer support (154A, 154B) using a temperature control or adjustment knob (240A, 240B) connected with a heater for the wafer support (154A, 154B). Spacing is adjusted using a spacing control or adjustment knob (242A, 242B) connected to the wafer support (154A, 154B). Adjusting the temperature and spacing may be sufficient to match dopants for film deposition in the two chambers within reasonable matching specification while not driving thickness matching out of specification, and vice versa. The inventors have discovered that with increasingly tighter matching specifications, however, it is difficult to achieve matching dopants without significantly impacting thickness matching.

By conducting a series of experiments to investigate the effects and potential interactions of varying the process parameters on BPSG film deposition, the inventors found that average film thickness has a strong dependence on flow, which can be almost 10 times greater than its dependence on wafer temperature. In contrast, boron incorporation can be about 10 times more sensitive to temperature than to flow. Therefore, flow can be tuned primarily to match film thickness, while temperature can be tuned primarily to match boron doping. Flow tuning can be performed by turning a micrometer of each upstream flow restrictor such as a needle valve. Temperature tuning can be performed by manipulating the temperature offset constant, $C_o$, which is an offset value assigned to a thermocouple used to read the temperature of the heater so that the average temperature of the heater can be changed. Phosphorus doping can be matched primarily by tuning the spacing S1, S2. Experiments show that by tuning the upstream flow restrictors 232A, 232B, film thickness difference of less than about 50 Å can be achieved while keeping the same process gas chemistry (i.e., process gas flows are not changed).

Figure 8:
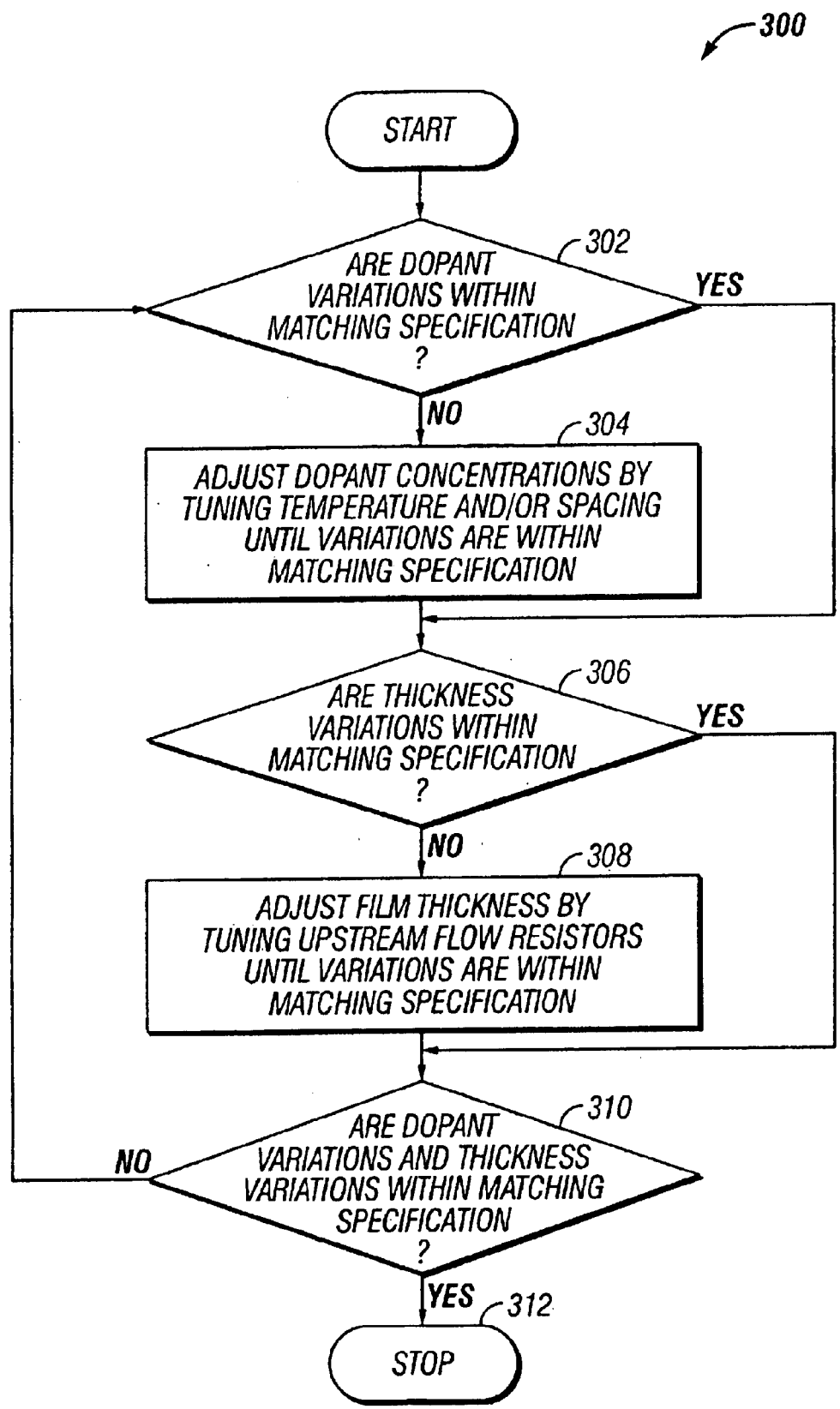
FIG. 8 is a flow diagram of a chamber matching procedure to produce equal gas distribution in the multiple chamber system of FIG. 6 according to an embodiment of the present invention.

FIG. 8 shows a flow diagram 300 of a chamber matching procedure according to one embodiment. At the start of chamber matching (step 302), the concentrations of dopant (s) in the films on the substrates in the chambers are compared to determine whether the variations are within the matching specification. If the answer is no, then the concentrations of dopant(s) in the films are adjusted by tuning the temperature of the substrate (e.g., by manipulating $C_o$) and/or the spacing between the flow distribution member (e.g., faceplate) and the substrate support in step 304 until the variations are within the matching specification. If the answer is yes, the method skips step 304 and proceeds to step 306. In step 306, the film thicknesses of the films on the substrates in the chambers are compared to determine whether the variations are within the matching specification. If the answer is no, then the film thicknesses are adjusted by tuning the upstream flow restrictors (e.g., needle valves) until the variations are within the matching specification (step 308). In step 310, the concentrations of dopant(s) and thicknesses of the films are compared to determine whether the variations are within the matching specification. If the answer is yes, the procedure is completed and terminated (step 312). If the answer is no, the matching procedure is repeated by returning to step 302.

The dopant concentration and thickness of the film on each substrate can be measured using a variety of methods. For example, the dopant concentration can be measured using an optical technique known as Fourier Transform Infrared Spectrometry (FTIR). The thickness can be measured using an optical technique known as X-Ray Fluorescence (XRF). The substrates are removed from the chambers for measurements. Based on the measurements, adjustments are made to the chambers for processing the next set of substrates.

Figure 9:
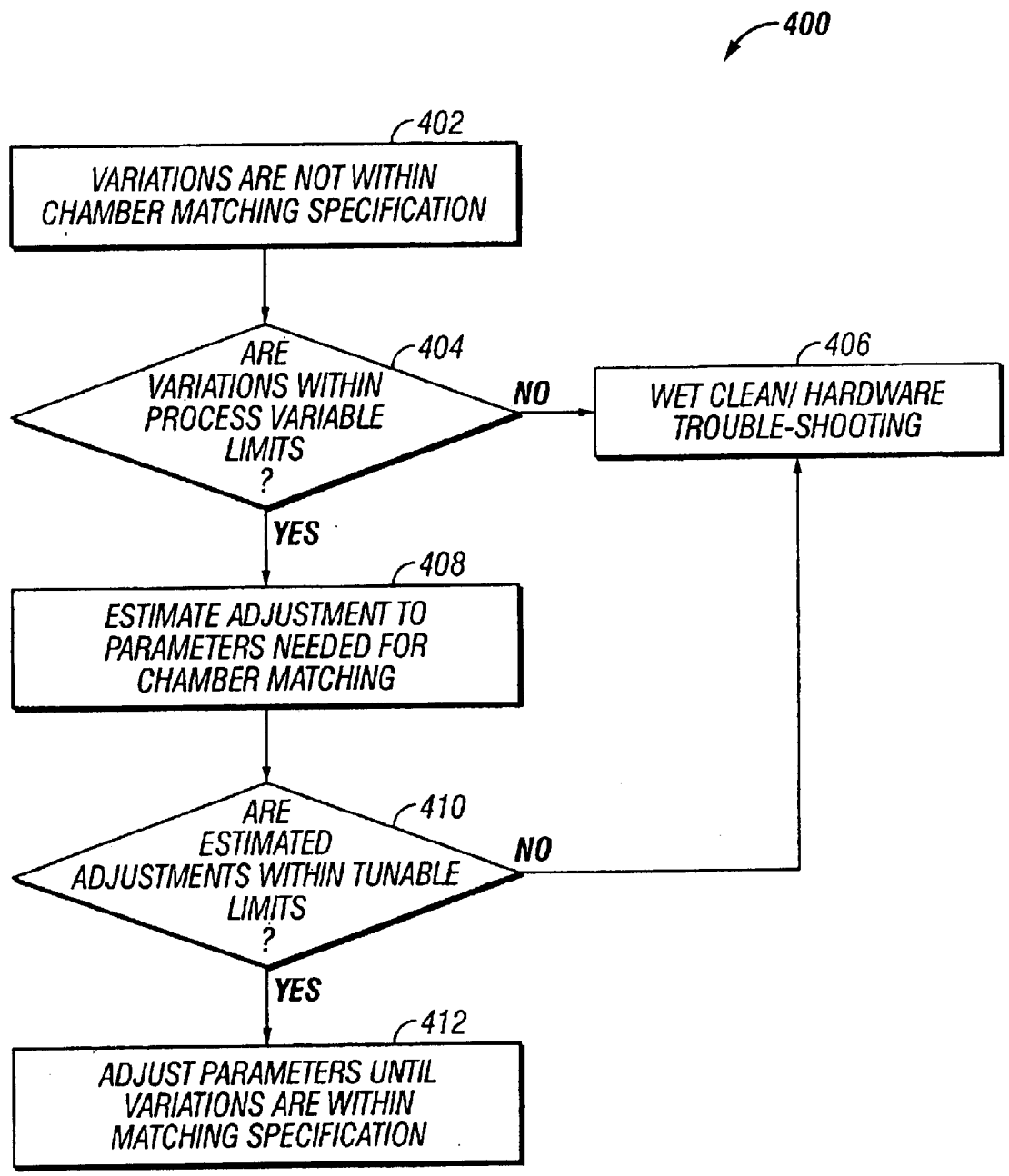
FIG. 9 is a flow diagram of a chamber matching procedure to produce equal gas distribution in the multiple chamber system for forming BPSG films according to an embodiment of the present invention.

FIG. 9 is a flow diagram 400 that illustrates a specific embodiment for deposition of BPSG films. At the start 402, it has been determined that the variations in dopant concentrations and/or film thicknesses are not within the matching specification. In step 404, the variations are evaluated to determine whether they are within the process variable limits. For example, the variation in phosphorus concentrations may be set at about 0.15 wt % or less, the variation in boron concentrations may be set at about 0.25 wt % or less, and the variation in film thicknesses may be set at about 200 Å to about 300 Å or less. These process variable limits may be changed depending on the system and process requirements. If the variations are not within the process variable limits, then the chamber matching procedure is halted, and a wet clean or hardware trouble-shooting is performed (step 406). A wet clean involves wiping down the chambers with DI water to remove, for instance, aluminum fluoride, silicon dioxide, or the like. Other hardware troubleshooting may involve inspection of wafer handling, wafer position relative to the faceplate, or the like. Wafer handling needs to be checked because processes tend to drift over time if the robots that deliver wafers lose track of their positions. If the wafer and the faceplate are not parallel, the resulting thickness and dopants can be nonuniform. If the variations are within the process variable limits, then the dopant concentrations and film thicknesses may be adjusted.

In step 408, the method estimates the adjustments to the tunable parameters (temperature, spacing, and upstream flow restriction) which are needed for chamber matching. The estimation may be made using computation worksheets or the like prepared based on experiments previously conducted for similar chambers and processes. These experiments generate data that can be used to estimate the adjustments. If the adjustments are not within tunable limits as determined in step 410, however, the chamber matching procedure is terminated, and a wet clean or hardware trouble-shooting is performed (step 406). For example, the tunable limit on the spacing may be at most about 15 mils, the tunable limit on the temperature may be at most about $C_o \leq 10$, and the tunable limit on the micrometer knob for the upstream flow restriction may be about 3–4 turns. If the adjustments are within tunable limits, then the adjustments are made until the matching specifications on phosphorus and boron concentrations and film thicknesses are met in step 412.

The adjustments of the temperature, spacing, and flow are meant to be relatively small to fine-tune the process conditions to achieve chamber matching by compensating for differences between the chambers such as minor manufacturing tolerances. Therefore, the variables (dopant concentrations and thicknesses) that can be corrected are subject to the process variable limits, and tunable limits are imposed on adjustments made to the process parameters (temperature, spacing, and upstream flow restriction), as described above. Experiments have been conducted to provide the values for these limits given above. Additional experiments can be performed to determine the limits for different chambers and process processes. The matching procedures allow IC manufacturers to produce film growth to be within about 1% of targeted values with dopant matching within about ±0.05 wt %.

The above chamber matching procedures can be used to calibrate the multiple chamber system prior to production runs for performing specific wafer manufacturing processes. By matching the chambers, the procedure ensures that even stringent wafer qualities are met while higher throughput is achieved.

The foregoing description of various embodiments of the invention has been provided for the purposes of understanding of the invention. The description is not intended to be exhaustive, or to limit the invention to precise forms described. For example, embodiments of the present invention may be used to match three or more chambers. Moreover, one or more of the chambers in the multiple chamber system may be configured to process simultaneously more than one wafer. Accordingly, numerous modifications and variations are possible in view of the teachings above.

What is claimed is:

1. A system for processing substrates, comprising:
    a plurality of process chambers, each process chamber including an inlet gas distribution member connected to an inlet gas line to distribute gas from the inlet gas line into the process chamber, a substrate support to support a substrate at a spacing distance from the inlet gas distribution member, and a gas outlet, the inlet gas distribution member having an inlet gas distribution member impedance to a gas flow through the inlet gas distribution member into the process chamber, the plurality of process chambers being substantially identical;
    a source gas delivery line connected to the inlet gas lines of the plurality of process chambers to supply a gas flow to be divided into the inlet gas lines; and
    a plurality of tunable upstream gas restrictors each disposed in one of the inlet gas lines connected to the inlet gas distribution members of the process chambers and being configured to adjust a flow rate into the corresponding process chamber, each upstream gas restrictor being tunable to adjust a tunable upstream gas restrictor impedance to achieve substantially identical process results in the plurality of chambers.

2. The system of claim 1 wherein each inlet gas distribution member comprises a faceplate having a plurality of faceplate apertures and being disposed at a distance from the substrate support.

3. The system of claim 2 wherein each inlet gas distribution member comprises a blocker plate disposed upstream of the faceplate and having a plurality of blocker plate apertures.

4. The system of claim 2 wherein each inlet gas distribution member comprises a mixing block disposed upstream of the faceplate.

5. The system of claim 1 wherein the gas outlets of the plurality of chambers are connected to a common exhaust line.

6. The system of claim 1 wherein each process chamber includes a temperature adjustment member coupled with the substrate support in the process chamber to adjust a temperature of the substrate support.

7. The system of claim 1 wherein each process chamber includes a spacing adjustment member coupled with the substrate support in the process chamber to adjust the spacing distance between the inlet gas distribution member and the substrate on the substrate support.

8. The system of claim 1 wherein the plurality of upstream gas restrictors are tunable to produce substantially equal gas flows from the inlet gas lines through the plurality of process chambers.

* * * * *